(12) United States Patent
Carver et al.

(10) Patent No.: US 11,762,447 B2
(45) Date of Patent: Sep. 19, 2023

(54) POWER SUPPLY WITH BOOST STAGE TO IMPROVE RIDE THROUGH PERFORMANCE

(71) Applicant: Schweitzer Engineering Laboratories, Inc., Pullman, WA (US)

(72) Inventors: Josh Carver, Pullman, WA (US); Robert Lopez, Jr., Palouse, WA (US); Arkanatha Sastry, Pullman, WA (US); Veselin Skendzic, Schwenksville, PA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 51 days.

(21) Appl. No.: 17/645,645

(22) Filed: Dec. 22, 2021

(65) Prior Publication Data

US 2023/0195194 A1    Jun. 22, 2023

(51) Int. Cl.
*G06F 1/26* (2006.01)
*G06F 1/32* (2019.01)
*G06F 1/3212* (2019.01)
*G06F 1/3296* (2019.01)

(52) U.S. Cl.
CPC .......... *G06F 1/3212* (2013.01); *G06F 1/3296* (2013.01)

(58) Field of Classification Search
CPC .............................. G06F 1/3212; G06F 1/3296
See application file for complete search history.

(56) References Cited

U.S. PATENT DOCUMENTS

| | | | |
|---|---|---|---|
| 3,733,519 | A | 5/1973 | Griffey |
| 4,447,841 | A | 5/1984 | Kent |
| 4,649,467 | A | 3/1987 | Vesce |
| 4,763,238 | A | 8/1988 | Maige |
| 4,928,200 | A | 5/1990 | Redl |
| 5,841,642 | A | 11/1998 | Fitzgerald |
| 5,901,054 | A | 5/1999 | Leu |
| 6,088,244 | A | 7/2000 | Shioya |
| 6,424,512 | B1 | 7/2002 | Schmacht |
| 7,230,409 | B1 | 6/2007 | Cox |
| 7,446,988 | B2 | 11/2008 | Balakrishnan |
| 7,764,476 | B2 | 7/2010 | Ker |
| 7,773,350 | B2 | 8/2010 | Balakrishnan |
| 7,773,392 | B2 | 8/2010 | Matsumoto |
| 8,050,006 | B2 | 11/2011 | Doppel |
| 8,537,570 | B2 | 9/2013 | Balakrishnan |
| 8,988,903 | B2 * | 3/2015 | Rice ........................ H02M 1/32 363/90 |

(Continued)

OTHER PUBLICATIONS

Philips Semiconductors, Power Semiconductor Applications, Chapter 2—Switched Mode Power Supplies, 1994.

*Primary Examiner* — Mohammed H Rehman

(74) *Attorney, Agent, or Firm* — Bradley W. Schield; Richard M. Edge

(57) ABSTRACT

A power supply includes a Primary or "high voltage" side and a Secondary or "low voltage" side. The primary side has boost stage circuitry that includes a boost stage controller that causes the boost stage circuitry to provide electrical energy, at least at a minimum boost voltage, to an energy storage capacitor. The energy storage capacitor may be charged by electrical energy at the minimum boost voltage and discharge electrical energy during a ride through event to power the electronic device.

18 Claims, 3 Drawing Sheets

(56) References Cited

U.S. PATENT DOCUMENTS

| | | | |
|---|---|---|---|
| 2006/0007614 A1* | 1/2006 | Pozzuoli | H02M 3/335 |
| | | | 361/62 |
| 2007/0153554 A1 | 7/2007 | Matsumoto | |
| 2007/0263331 A1* | 11/2007 | Leuthen | H02H 7/1222 |
| | | | 361/78 |
| 2007/0274112 A1 | 11/2007 | Lalithambika | |
| 2008/0197811 A1* | 8/2008 | Hartular | H02J 7/00714 |
| | | | 320/141 |
| 2010/0202167 A1 | 8/2010 | Yang | |
| 2010/0302813 A1 | 12/2010 | Lu | |
| 2010/0320837 A1* | 12/2010 | Harrison | H02J 1/04 |
| | | | 307/26 |
| 2011/0260703 A1 | 10/2011 | Laur | |
| 2012/0243269 A1* | 9/2012 | Ren | H02M 3/33507 |
| | | | 363/21.12 |
| 2013/0320869 A1* | 12/2013 | Jans | H05B 45/382 |
| | | | 315/200 R |
| 2014/0334193 A1* | 11/2014 | Meyer | H02M 7/537 |
| | | | 363/21.01 |
| 2017/0302157 A1* | 10/2017 | Lin | H02M 3/33523 |

* cited by examiner

POWER SUPPLY WITH BOOST STAGE TO IMPROVE RIDE THROUGH PERFORMANCE

TECHNICAL FIELD

The present disclosure generally relates to power supplies, and, more particularly, to a power supply with a boost stage on a high voltage side that allows for increased and consistent ride through performance.

DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Electrical power generation and delivery systems are designed to generate, transmit, and distribute electrical energy to loads. Electrical power generation and delivery systems may include equipment, such as electrical generators, electrical motors, power transformers, power transmission and distribution lines, circuit breakers (CBs), disconnects, buses, voltage regulators, capacitor banks, and the like. Such equipment may be monitored, controlled, automated, and/or protected using intelligent electronic devices (IEDs) that receive electric power system information from said systems, IEDs can make decisions based on the information, and provide monitoring, control, protection, and/or automated signaling to the equipment.

IEDs may be powered by a power supply connected to a power system. Power supplies may receive electrical energy from a power source and convert the electrical energy to a form that the IED uses to operate IEDs may be installed in a wide variety of physical locations with different voltages available to power the IED. One technique used to address the different power system voltage availability is to make different IEDs and power supplies which operate based on available input voltages. However, having different IEDs/power supplies for different input voltages increases installation complexity, decreases reuse of IEDs, and limits the ability to relocate IEDs.

As explained below, the same power supply may be used with a variety of different power system voltages (e.g., alternating current (AC), direct current (DC), higher voltage, or lower voltages) to provide electrical energy with appropriate electrical characteristics. The power supply may have a primary voltage side, also referred to as a high voltage side, that may include a boost stage that boosts the input voltage to a minimum boost voltage to be subsequently stepped down to the desired voltage for consumption by the IED. Further, the power supply may have an energy storage capacitor on the high voltage side that allows for improved ride through performance. By having the energy storage capacitor on the high voltage side following the boost stage and due to the capacitor's ability to store energy proportional to the square of the voltage, $V^2$, the power supply may have a lower energy storage capacitor, improved ride through performance, and/or a combination thereof.

Figure 1:
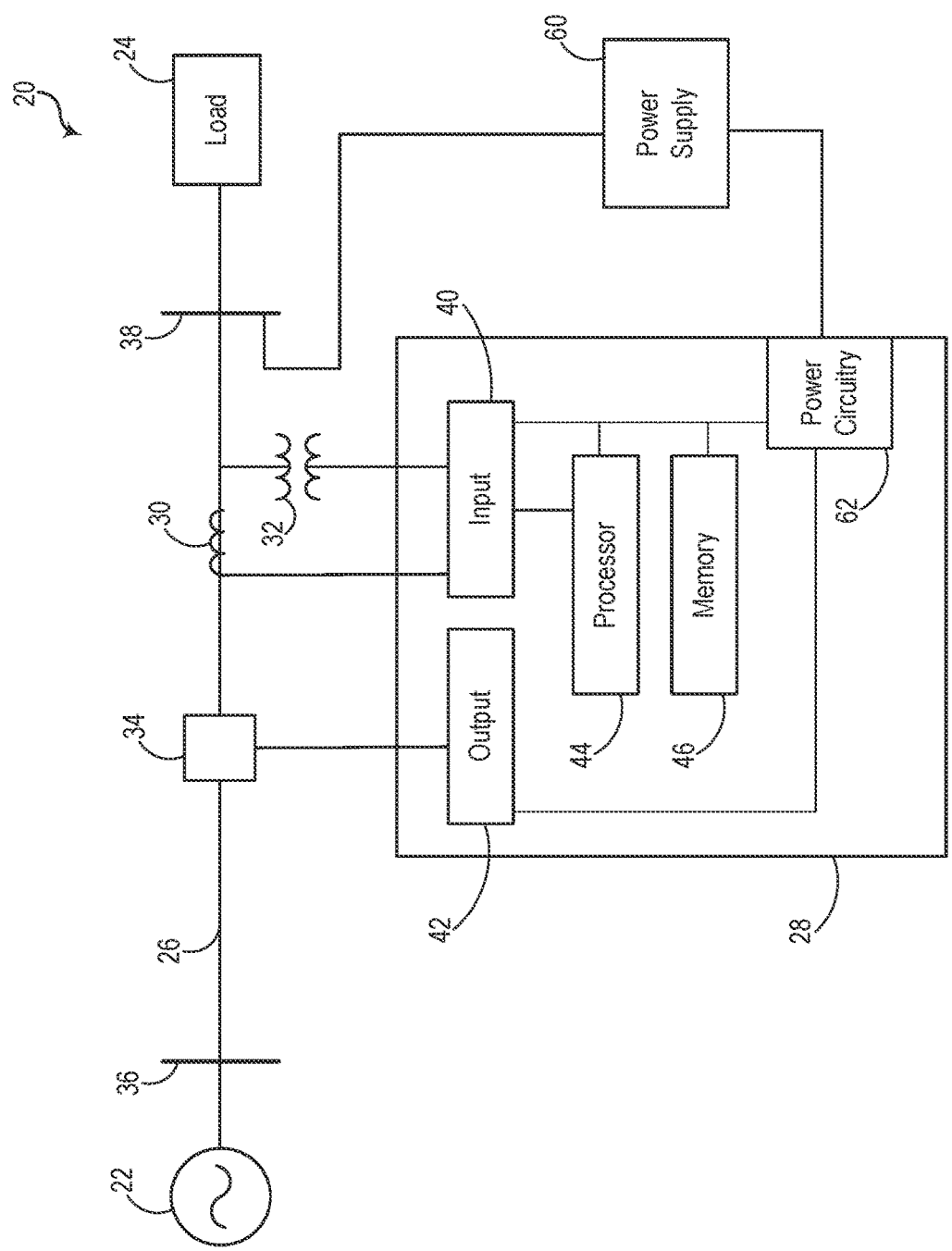
FIG. 1 illustrates a block diagram of a power system with an intelligent electronic device (IED) that receives electrical energy from the power system via a power supply to allow the IED to perform operations to monitor, control, and/or protect the power system, in accordance with an embodiment.

FIG. 1 is a block diagram of an electric power delivery system 20 that generates, transmits, and distributes electrical energy to loads. The electric power delivery systems may include equipment, such as generators (e.g., generator 22), power transformers, loads (e.g., load 24), power transmission and delivery lines (e.g., power line 26), buses (e.g., buses 36 and 38), CBs (e.g., CB 34), and a variety of other electrical equipment.

The generator 22 may provide electrical energy to the loads 24 via the power line 26. In the illustrated embodiment, the electric power delivery system 20 may be monitored, controlled, automated, and/or protected using intelligent electronic devices (IEDs), such as IED 28. In general, IEDs in an electric power generation and transmission system may be used for protection, control, automation, and/or monitoring of equipment in the system. For example, IEDs may be used to monitor equipment of many types, including electric transmission lines, electric distribution lines, current transformers, busses, switches, circuit breakers, reclosers, voltage transformers, autotransformers, tap changers, voltage regulators, capacitor banks, generators, motors, pumps, compressors, valves, and a variety of other types of monitored equipment. Such IEDs may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, digital sample publishing units, merging units, and the like. The term IED may be used to describe an individual IED or a system comprising multiple IEDs.

The power system 20 includes current transformer(s) (CTs) 30, potential transformer(s) (PT(s)) 32, and circuit breaker(s) (CBs) 34. The IED may be communicatively coupled to the CTs 30 and PTs 32 to receive signal(s) indicating current measurements and/or voltage measurements of the power line. Further, IED 28 may be communicatively coupled to CB 34 to send signal(s) to CB 34 to electrically connect or disconnect electrical equipment from the power system based upon current measurements and/or voltage measurements of the power system 20. While a single phase is shown in FIG. 1, note that this is simply meant to be illustrative and any suitable number of phases (e.g., three phases) may be monitored and/or protected.

In the illustrated embodiment, the IED 28 includes inputs 40, outputs 42, a processor 44, and memory 46. The IED 28 may include one or more bus(es) and other circuit components connecting the processor 44 to the memory 46, the input 40, and the outputs 42. The memory 46 may be any suitable computer-readable data storage medium. The processor 44 may operate using any number of processing rates and architectures. The processor 44 may be embodied as a microprocessor. The processor 44 and/or the memory 46 may be referred to generally as processing circuitry.

The IED 28 may perform the operations using electrical energy supplied by the power system 20. The IED 28 may include power circuitry 62 that receives electrical energy to provide power to the electrical components of the IED 28 to allow the IED to perform the monitoring, control, and/or protection operations. The power circuitry 62 may receive electrical energy with expected characteristics (e.g., voltage characteristics, current characteristics, etc.) via a power supply 60.

Power supply 60 may be connected to different input voltages depending on the availability at the location. For example, in some cases, the IED 28 may be connected to a 120V alternating current (AC) mains voltage. In other cases, the IED 28 may be connected to a 24-48V direct current (DC) source available to a set of devices. One technique is to have different power supplies/IEDs that are designed to accept each of the different input voltages. However, having IEDs for each specific input voltage may increase the difficulty in reusing or changing IED locations. As such, a power supply that allows for a range of different input voltages may be desirable to allow the same IED and/or power supply to be used in various locations.

Figure 2:
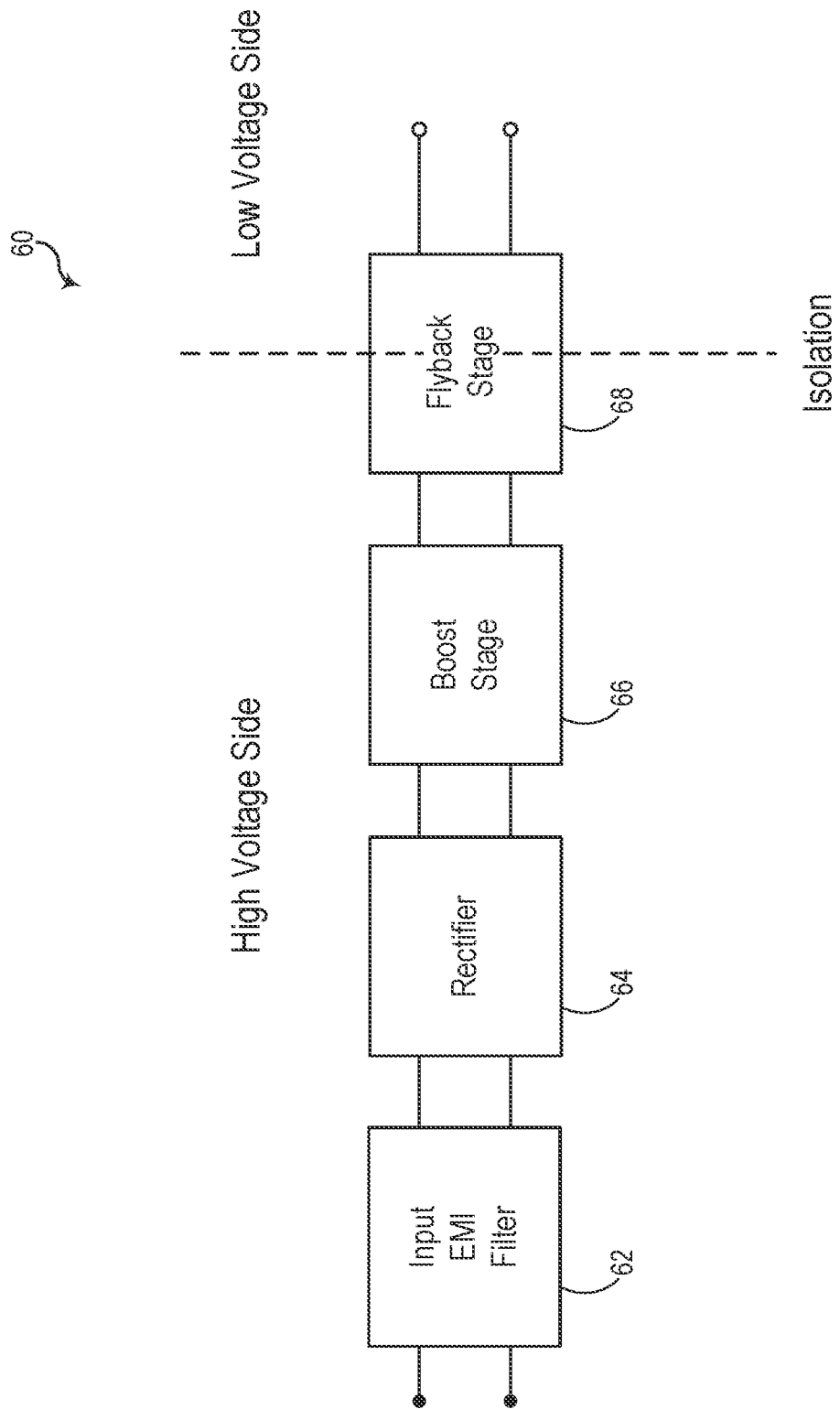
FIG. 2 is a functional block diagram of the functions performed by the power supply of FIG. 1, in accordance with an embodiment.

FIG. 2 is a functional block diagram of a power supply 60 that may be used to power the IED 28 illustrated in FIG. 1. Power supply 60 may be powered by different input voltages of AC or DC type. Power supply 60 includes electromagnetic interference (EMI) filter 62 that filters electromagnetic interference received input power. The power supply 60 further includes rectifier 104 to rectify an AC input to a direct current (DC) form when the received electrical energy is of AC form. The rectifier may output DC electrical energy to a boost stage 66. The boost stage 66 may boost (i.e., increase) the voltage of the received electrical energy to at least a minimum boost voltage. For example, when the input voltage is 24-48V$_{DC}$, the boost stage 66 may boost the voltage up to 80V$_{DC}$ and may allow electrical energy of higher voltages, such as rectified 120V$_{AC}$, to continue to the flyback stage 68, thus bypassing boost stage 66.

The boost stage 66 may provide the electrical energy at the boosted voltage to a flyback stage 68. The flyback stage 68 may include isolation between the high voltage side and a low voltage side, also referred to as the secondary voltage side, as well as provide a regulated and reduced voltage. The low voltage side may then be used to power devices on a low voltage bus (e.g., a 12V rail) and/or to power the IED 28 via the power circuitry 62.

As explained below, the boost stage 66 may also include an energy storage capacitor that may be used to deliver electrical energy to the IED 28 during events resulting in loss of input power (e.g., ride-through events) to maintain operation of the IED 28 over a period of time. That is, the boost stage 66 may control operation of a switching device to increase the output voltage of the received electrical energy to a desired voltage to allow the energy storage capacitor to have sufficient charge to maintain operation of the IED 28 during the events. The energy stored in a capacitor may be given as:

$$E_{capacitor} = \frac{1}{2}CV^2 \quad (1)$$

where C is the capacitance of the capacitor and V is the voltage across the capacitor. By having the energy storage capacitor on the high voltage side, the energy storage capacitor may be orders of magnitude (e.g., 5 times, 10 times, 20 times, etc.) smaller and/or may store more energy than if the energy storage capacitor were placed on the low voltage side due to the energy storage being proportional to V$^2$.

Figure 3:
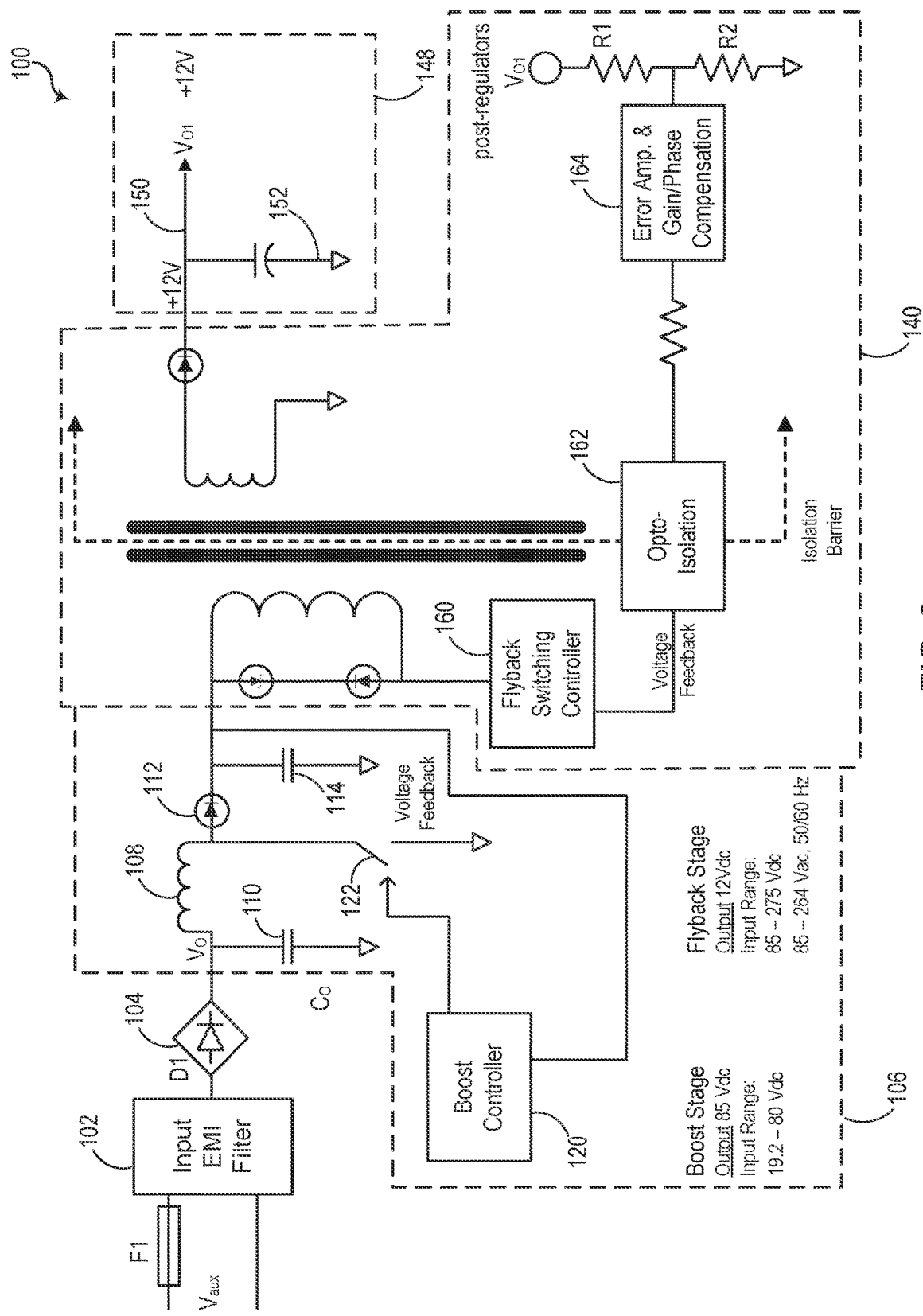
FIG. 3 is a circuit diagram of the power supply of FIG. 1 that may be used to provide power to the IED, in accordance with an embodiment

FIG. 3 is a circuit block diagram of power supply 100 that may be included in the power supply 60. Note that, while particular components and voltages are shown in FIG. 3 to illustrate the functional properties of the power supply circuitry 100, this is simply meant to be used as an elementary example. Additional/alternative components and/or electrical properties may be suitable and appropriate. As illustrated, power supply circuitry 100 includes an input EMI filter 102 and rectifier 104. Power supply circuitry 100 includes boost stage circuitry 106, such as a boost inductor 108, capacitor 110, diode 112, and energy storage capacitor 114. Boost stage circuitry 106 may include a boost controller 120 that controls operation of a switching device 122 to cause charging and discharging of the inductor 108 that boosts an output voltage of boost stage circuitry 106. The boost inductor 108 may be embodied as a single inductor or a coupled inductor. Energy storage capacitor 114 may receive electrical energy at the output of boost stage circuitry 106 to charge inductor 108 at the boosted voltage. As mentioned previously, increasing the voltage of the electrical energy being stored in the energy storage capacitor may result in a smaller capacitor, smaller PCB real estate, and/or increased ride through performance (e.g., faster charge time and/or longer ride through duration) of the energy storage capacitor, thereby reducing complexity of power supply 60.

Boost controller 120 may receive a voltage feedback signal at the output of the boost stage circuitry 106. Boost controller 120 may increase or decrease the duty cycle of switching device 122 based on the voltage feedback signal to maintain the output voltage of the electrical energy at least at the minimum boost voltage required by boost stage circuitry 106. By adjusting the duty cycle of boost control circuitry 106 to maintain at least the minimum boost voltage, energy storage capacitor 114 may be charged with sufficient energy to provide electrical energy during ride through events. For example, if a ride through event occurs in which the power system 20 cannot provide adequate power for a predetermined period of time (e.g., 1, 5, 10, 20, 40, 60, 80, 100, 200 milliseconds, 1 second, 2 seconds, 5 seconds, etc.), then the boost controller 120 may maintain the output voltage at the minimum boost voltage to ensure energy storage capacitor 114 is charged sufficiently to continue powering IED 28 throughout the predetermined period of time.

As illustrated, power supply circuitry 100 may include flyback stage circuitry 140 that receives the electrical energy from boost stage circuitry 106 and/or energy storage capacitor 114 at the minimum boost voltage. Flyback stage circuitry 140 may include a flyback switching controller 160 that controls a switching device of flyback stage circuitry 140. The switching device allows primary side windings of a transformer to be charged when closed and allows voltage to be induced on the secondary side windings of the transformer when opened, thereby allowing the secondary side to provide power to the IED 28. Flyback stage circuitry 140 may include an isolation barrier that divides (i.e., galvanically isolates) the high voltage (primary) side of the flyback stage circuitry 140 and the low voltage (secondary) side that may be connected to a lower voltage rail, which may be then connected to the IED 28. In some embodiments, the low voltage side may not include an energy storage capacitor or an energy storage capacitor with a reduced capacitance due to the energy storage capacitor present on the high side. Flyback stage circuitry 140 may include opto-isolator 162 to allow voltage feedback of the output voltage on the low voltage side while maintaining the isolation between the high and the low voltage sides. In the illustrated embodiment, an error amplifier and compensation block 164 is shown providing a voltage feedback signal via opto-isolator 162 to allow flyback switching controller 160 to control the output voltage on the low voltage side.

The power supply circuitry 100 includes output circuitry 148 that has an output capacitor 152 and a voltage bus 150. The output capacitor 152 may be charged via the flyback stage circuitry 140 and supply energy to the output loads, thereby allowing the power supply 60 to provide power to the IED. In some embodiments, the output circuitry 148 may be connected to a lower voltage bus rail or may be connected directly to the IED Boost controller 120, controls operation of the boost stage circuitry 106 on the high voltage side to ensure at least the minimum boost voltage is supplied to flyback stage circuitry 140, the energy storage capacitor 114 may ensure ride through performance of the power supply corresponding to the minimum boost voltage independent of the various allowable input voltages received by the power supply 60. For example, by ensuring charging of energy storage capacitor 114 to at least the minimum boost voltage via the voltage feedback and control of the switching device by the boost controller 120, the power supply circuitry 100 may ensure ride through operation of the IED for a predetermined period of time (e.g., 1, 5, 10, 20, 40, 60, 80, 100, 200 milliseconds, etc.) during a ride through event. The inclusion of the boost stage circuitry 106 may equalize performance of any of the various accepted input voltages to that of the maximum input performance of a non-boosted topology that has a predetermined input voltage. The initial charge time of the energy storage capacitor may be faster than a secondary side ride through module given that the capacitance may be designed to be lower. By having the boost controller 120 controlling output voltages of the boost stage circuitry 106 to the flyback stage circuitry 140, the power supply may be connected to a variety of power sources, including both AC and DC power sources with different voltage levels. In the illustrated embodiment, the same power supply 60 may be connected to 24-48 $V_{DC}$ power sources, $120V_{AC}$ power sources, 240 $V_{AC}$ power sources, and a variety of others.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A power supply, comprising:
a primary voltage side comprising:
input circuitry configured to receive electrical energy from a power source;
boost stage circuitry comprising:
a switching device; and
a boost stage controller configured to cause the boost stage circuitry to provide the electrical energy, at least at a minimum boost voltage, to an energy storage capacitor by controlling switching of the switching device based on voltage feedback of an output voltage of the boost stage circuitry; and
an energy storage capacitor configured to be charged by the electrical energy from the boost stage circuitry at least to the minimum boost voltage and to discharge the charged electrical energy during a ride through event in which the power source does not provide sufficient electrical energy to power an electronic device, thereby allowing the electronic device to continue operation during the ride through event;
a secondary voltage side comprising output circuitry configured to provide the electrical energy to power the electronic device; and,
flyback switching circuitry between the energy storage capacitor and the secondary voltage side, wherein the flyback switching circuitry comprises isolation circuitry that maintains galvanic isolation between the primary voltage side and the secondary voltage side, wherein the flyback switching circuitry is configured to receive the electrical energy from the energy storage capacitor, the boost stage circuitry, or a combination thereof, and provide electrical energy to the secondary voltage side at a reduced regulated voltage.

2. The power supply of claim 1, wherein the flyback switching circuitry comprises a flyback controller configured to control the electrical energy being output to the electronic device based on voltage feedback obtained using an opto-isolator to maintain the galvanic isolation between the secondary voltage and primary voltage sides.

3. The power supply of claim 1, wherein the primary voltage side comprises a rectifier configured to rectify alternating current (AC) received via the input circuitry.

4. The power supply of claim 1, wherein the boost stage circuitry comprises a voltage sensor configured to monitor the boost voltage to allow the boost stage controller to adjust a duty cycle of the switching device to maintain the boost voltage to at least at the minimum boost voltage.

5. The power supply of claim 4, wherein the energy storage capacitor and the voltage sensor are electrically coupled at an output of the boost stage circuitry.

6. The power supply of claim 1, wherein the energy storage capacitor is configured to discharge the electrical energy to enable a ride through performance of the electronic device by at least 100 milliseconds, thereby allowing continued operation of the electronic device during ride through events of the power source.

7. The power supply of claim 1, wherein the boost stage comprises a single inductor or a coupled inductor.

8. The power supply of claim 1, wherein the boost stage controller is configured to allow the electrical energy to remain at a higher voltage than the expected boost voltage when the input voltage is greater than the minimum required boost voltage.

9. A system, comprising:
an intelligent electronic device (IED) configured to perform at least one of monitoring, control, and protection operations on a power system, wherein the IED comprises power circuitry configured to power processing circuitry of the IED to allow the IED to operate; and
a power supply, comprising:
input circuitry on a primary voltage side, wherein the input circuitry is configured to receive electrical energy from a power source of the power system;
boost stage circuitry on the primary voltage side, wherein the boost stage circuitry comprises:
a switching device;

a boost stage controller configured to control the switching device to cause the boost stage circuitry to boost an input voltage to at least a minimum boost voltage; and an energy storage capacitor configured to be charged to at least the minimum boost voltage and to discharge the electrical energy during a ride through event in which the power source does not provide sufficient electrical energy to power the IED, thereby allowing the IED to continue operation during the ride through event;

output circuitry on a secondary voltage side, wherein the output circuitry is configured to provide electrical energy to the IED; and, flyback switching circuitry between the energy storage capacitor and the secondary voltage side, wherein the flyback switching circuitry comprises isolation circuitry that maintains galvanic isolation between the primary voltage side and the secondary voltage side, wherein the flyback switching circuitry is configured to receive the electrical energy from the energy storage capacitor, the output of the boost stage controller, or a combination thereof, and provide electrical energy to the secondary voltage side at a reduced regulated voltage.

10. The system of claim 9, comprising electromagnetic interference (EMI) circuitry, a rectifier, and flyback stage circuitry on the primary voltage side, wherein the boost stage circuitry is electrically connected between the rectifier and the flyback stage circuitry to receive direct current (DC) electrical energy from the rectifier and to boost the received DC electrical energy to at least the minimum boost when the received DC electrical energy is less than the minimum boost voltage.

11. The system of claim 9, wherein the input circuitry is configured to receive a range of different input voltages at least between 24 volts and 264 volts.

12. The system of claim 9, wherein the flyback switching circuitry comprises a flyback controller configured to control the electrical energy being output to the electronic device based on voltage feedback obtained using an isolated Error Amplifier, which includes gain phase compensation, to maintain the galvanic isolation between the secondary voltage and primary voltage sides.

13. The system of claim 9, wherein the primary voltage side comprises a rectifier configured to rectify alternating current (AC) received via the input circuitry.

14. The system of claim 9, wherein the energy storage capacitor and a voltage sensor of boost stage circuitry is electrically coupled between an output of the boost stage circuitry, wherein the boost stage controller controls switching of the switching device based on feedback of the voltage sensor to ensure that the energy storage capacitor is charged to at least the minimum boost voltage.

15. The system of claim 9, wherein the energy storage capacitor is electrically coupled between boost stage circuitry components and flyback switching circuitry to store the electrical energy output from the boost stage circuitry at a higher voltage prior to being decreased by the flyback switching circuitry.

16. A method, comprising:
receiving, via an input of a power supply, electrical energy from a power source;

boosting, via boost stage circuitry on a primary voltage side of the power supply, an input voltage of the electrical energy to at least a minimum boost voltage to charge an energy storage capacitor of the boost stage circuitry to at least the minimum boost voltage based on voltage feedback of the boost stage circuitry, wherein charging the energy storage capacitor to at least the minimum boost voltage ensures that the power supply provides sufficient electrical energy to power an electrical device during a ride through event;

providing, via a secondary voltage side of the power supply, the electrical energy to power the electronic device, and;

maintaining galvanic isolation between the primary voltage side and the secondary voltage side using flyback switching circuitry between the energy storage capacitor and the secondary voltage side by the flyback switching circuitry:

receiving the electrical energy from the energy storage capacitor, the output of the boost stage controller, or a combination thereof, and providing electrical energy to the secondary voltage side at a reduced regulated voltage.

17. The method of claim 16, comprising rectifying, via a rectifier of the power supply, the electrical energy prior to the boost stage circuitry.

18. The method of claim 16, comprising filtering, via electromagnetic interference circuitry of the power supply, the electrical energy received from the power source.

* * * * *